United States Patent [19]

Yamawaki et al.

[11] Patent Number: 5,781,222
[45] Date of Patent: Jul. 14, 1998

[54] OPTICAL INFORMATION RECORDING/ REPRODUCING APPARATUS SUPPLYING A SMALLER HIGH-FREQUENCY CURRENT TO A FIRST SEMICONDUCTOR LASER FOR GENERATING A LIGHT BEAM TO RECORD INFORMATION THAN TO A SECOND SEMICONDUCTOR LASER FOR REPRODUCING RECORDED INFORMATION

[75] Inventors: Takeshi Yamawaki, Tokyo; Akira Miyashita, Tokorozawa, both of Japan

[73] Assignee: Canon Kabushiki Kaisha, Tokyo, Japan

[21] Appl. No.: 491,111

[22] Filed: Jun. 16, 1995

[30] Foreign Application Priority Data

Jun. 21, 1994 [JP] Japan ........................ 6-138639

[51] Int. Cl.⁶ .................. B41J 2/47; B41J 2/435; H01S 3/00; G02B 26/02
[52] U.S. Cl. .................. 347/236; 347/237; 347/246; 347/247
[58] Field of Search .................. 347/237, 236, 347/246, 247

[56] References Cited

U.S. PATENT DOCUMENTS

| | | | |
|---|---|---|---|
| 4,751,524 | 6/1988 | Balchunas | 347/247 |
| 4,787,078 | 11/1988 | Yokogawa | |
| 4,819,242 | 4/1989 | Kaku et al. | |
| 5,034,757 | 7/1991 | Godlove | 347/237 |
| 5,317,344 | 5/1994 | Beaman et al. | 347/237 |
| 5,512,932 | 4/1996 | Rolfe | 347/247 |
| 5,548,320 | 8/1996 | Yamanaka et al. | 347/246 |
| 5,581,296 | 12/1996 | Tanimoto et al. | 347/237 |

FOREIGN PATENT DOCUMENTS

| | | |
|---|---|---|
| 0628960 | 12/1994 | European Pat. Off. |
| 2595857 | 9/1987 | France |
| 59-9086 | 2/1984 | Japan |
| 03203820 | 9/1991 | Japan |
| 0573948 | 3/1993 | Japan |

OTHER PUBLICATIONS

Patent Abstracts of Japan, vol. 015, No. 268, published Jul. 8, 1991, English Abstract of Jap. Pat. No. 03-088143.
Patent Abstracts of Japan, vol. 013, No. 064, publsihed Feb. 14, 1989, English Abstract of Japanese Pat. No. 63-251946.
Patent Abstracts of Japan, vol. 017., No. 662, published Dec. 7, 1993, English Abstract of Jap. Pat. No. 5-217192.

*Primary Examiner*—Safet Metjahic
*Assistant Examiner*—Christopher E. Mahoney
*Attorney, Agent, or Firm*—Fitzpatrick, Cella, Harper & Scinto

[57] ABSTRACT

An optical information recording and/or reproducing apparatus includes a first semiconductor laser for generating a light beam for recording or erasing information on an optical information recording medium. Also provided is a second semiconductor laser for generating a light beam for reproducing recording information from the optical information recording medium, and a first direct current supplying circuit for supplying a first direct current to the first semiconductor laser. A second direct current supplying circuit supplies a second direct current to the second semiconductor laser, and a high-frequency current supplying circuit supplies high-frequency currents to the first semiconductor laser and the second semiconductor laser. The high-frequency current supplying circuit supplies a smaller high-frequency current to the first semiconductor laser than to the second semiconductor laser.

3 Claims, 3 Drawing Sheets

OPTICAL INFORMATION RECORDING/REPRODUCING APPARATUS SUPPLYING A SMALLER HIGH-FREQUENCY CURRENT TO A FIRST SEMICONDUCTOR LASER FOR GENERATING A LIGHT BEAM TO RECORD INFORMATION THAN TO A SECOND SEMICONDUCTOR LASER FOR REPRODUCING RECORDED INFORMATION

BACKGROUND OF THE INVENTION

1. Field of the Invention

The present invention relates to an optical information recording and/or reproducing apparatus for recording and/or reproducing information using a plurality of semiconductor lasers. More particularly, the invention relates to a laser drive apparatus for driving a plurality of semiconductor lasers each by a high-frequency current superimposed on a direct current.

2. Related Background Art

A conventionally known problem in reproducing information from an optical disc is a phenomenon of return beam noise in reflected light from an optical disc that returns to a semiconductor laser of a light source to couple with a radiative portion of the semiconductor laser, thereby making the light output unstable. A specific example of a method for reducing such noise is described in Japanese Patent Publication No. 59-9086, in which a circuit for driving a semiconductor laser includes a direct current source and a high-frequency current source to superimpose a high-frequency current on a direct current and the minimum value of the superimposed high-frequency current is set smaller than a threshold current of the semiconductor laser, thereby achieving an oscillation spectrum of the semiconductor laser in the multiplex longitudinal mode. According to this method, when the oscillation spectrum of the semiconductor laser is in the multiplex longitudinal mode, reflected light from a recording medium weakens the coupling with the radiative portion of the semiconductor laser upon reaching the semiconductor laser, thereby suppressing the noise.

Incidentally, for recording information in a recording medium, the output of the direct current source is increased to achieve high-power radiation of the semiconductor laser. However, the superposition of the high-frequency current results in modulating the light output by high frequency waves, which possibly causes the maximum value of the high-frequency current to surpass the rated value of the semiconductor laser. This could lower the reliability of the semiconductor laser and in turn could result in breakage of the laser. To overcome such a problem, there is known an apparatus arranged to change the amplitude or the duty of the high-frequency current between upon recording of information and upon reproduction thereof, for example as proposed in Japanese Laid-open Patent Application No. 5-73948. Describing it with FIG. 1, a control unit 106 applies different reverse bias voltages Vb between upon recording and upon reproduction of information to variable capacitance diodes CD1 and CD2 provided between a high-frequency current source 102 and a semiconductor laser 101, whereby the capacitances of the variable capacitance diodes CD1 and CD2 are changed so as to change the amplitude of the high-frequency current superimposed on the semiconductor laser 101.

Generally, optical information recording and/or reproducing apparatus for optically recording and/or reproducing information are classified as using a one-light-source method, which uses one light source (semiconductor laser) for recording and reproduction and a multiple light source method, using a plurality of light sources, for example separate light sources, for recording and for reproduction. When the apparatus of FIG. 1 is applied to the multiple light source method, a problem arises from the difference of oscillation frequency. Namely, if the individual semiconductor lasers are each provided with a high-frequency current source and a circuit for making the amplitude of the high-frequency current variable, beat noise is generated by cross-talk between channels due to the difference of oscillation frequency between the high-frequency current sources. If the beat noise is mixed in the reproduction signal band, the quality of signal is extremely degraded, which is especially noticeable in the case of use of the monolithic multi-channel lasers.

To cope with such a problem there is apparatus, for example as disclosed in Japanese Laid-open Patent Application No. 3-203820. Describing it with FIG. 2, a common high-frequency oscillation circuit 102 is provided for a plurality of semiconductor lasers 101A, 101B, and impedance matching circuits 103A, 103B couple the high-frequency oscillation circuit 102 with the semiconductor lasers 101A, 101B, respectively, whereby the internal impedances of the semiconductor lasers 101A, 101B are matched with an output impedance of the high-frequency oscillation circuit 102. Since this type of apparatus has a common high-frequency oscillation circuit 102, no beat noise appears, and thus, a high-frequency current with sufficient amplitude can be superimposed on direct currents supplied from the direct current sources 104, 105 to the semiconductor lasers 101A, 101B.

Meanwhile, it is conceivably possible that a drive apparatus obtained by combining the laser drive apparatus of FIG. 2 with the technology for making the amplitude of the high-frequency superimposing current of the semiconductor laser variable as described in FIG. 1 is applied to an optical recording apparatus provided with a plurality of semiconductor lasers. In more detail, the variable capacitance diodes of FIG. 1 are provided for the impedance matching circuits 103A, 103B of FIG. 2; upon reproduction of information (low power emission) the voltages applied to the variable capacitance diodes are controlled so as to keep the impedance matching good; upon recording of information (high power emission) the voltages applied to the variable capacitance diodes are controlled so as to keep the impedance matching in a non-matching state.

The combination of the two laser drive apparatus in the above manner, however, has the following problems.

(1) Since the circuits for performing impedance matching are each constructed of a combination of coils and capacitors, or of a microstrip line in the high-frequency band of over 50 MHz, the arrangement with these circuits provided for the respective semiconductor lasers makes the circuit layout complex and necessitates a large packaging area so as to increase the size of apparatus.

(2) Since the impedance matching circuits are each constructed of a resonance circuit, high-frequency application characteristics are likely to be affected by variations of the oscillation frequency, and the individual impedance matching circuits could affect each other to make the operation unstable, for example to causing abnormal oscillation.

(3) Accordingly, to change the high-frequency superimposing current depending upon the emission power of semiconductor laser is not preferred due to items (1), (2).

SUMMARY OF THE INVENTION

The present invention has been accomplished taking account of the above problems, and an object of the present invention is to provide an optical information recording and/or reproducing apparatus which can simplify the circuit layout and which includes no possibility for causing an unstable operation such as an abnormal oscillation, thereby enabling the service to perform a stable operation.

The object of the present invention can be achieved by an optical information recording and/or reproducing apparatus for driving a plurality of semiconductor lasers comprising a semiconductor laser for recording or erasing of information and a semiconductor laser for reproduction of information by supplying a direct current and a high-frequency current to each of the semiconductor lasers, which is provided with a high-frequency oscillation circuit for supplying high-frequency currents to the plurality of semiconductor lasers, wherein the high-frequency oscillation circuit and the reproduction semiconductor laser are coupled with each other through a tuning circuit for performing matching of impedance, whereby a high-frequency current sufficient to obtain a reproduction signal is supplied to the reproduction semiconductor laser, and wherein the high-frequency oscillation circuit and the recording or erasing semiconductor laser are coupled with each other through an aperiodic circuit with a low coupling efficiency, whereby a high-frequency current is supplied to the recording or erasing semiconductor laser in a considerably smaller amount than the high-frequency current supplied to the reproduction semiconductor laser.

Also, since the recording or erasing semiconductor laser is also used for generation of a servo signal, a high-frequency current sufficient to obtain a servo signal is supplied to the recording or erasing semiconductor laser.

Further, the plurality of semiconductor lasers are constructed as a monolithic multi-beam semiconductor laser in which the semiconductor lasers are formed on the same substrate.

DETAILED DESCRIPTION OF THE PREFERRED EMBODIMENT

Figure 1:
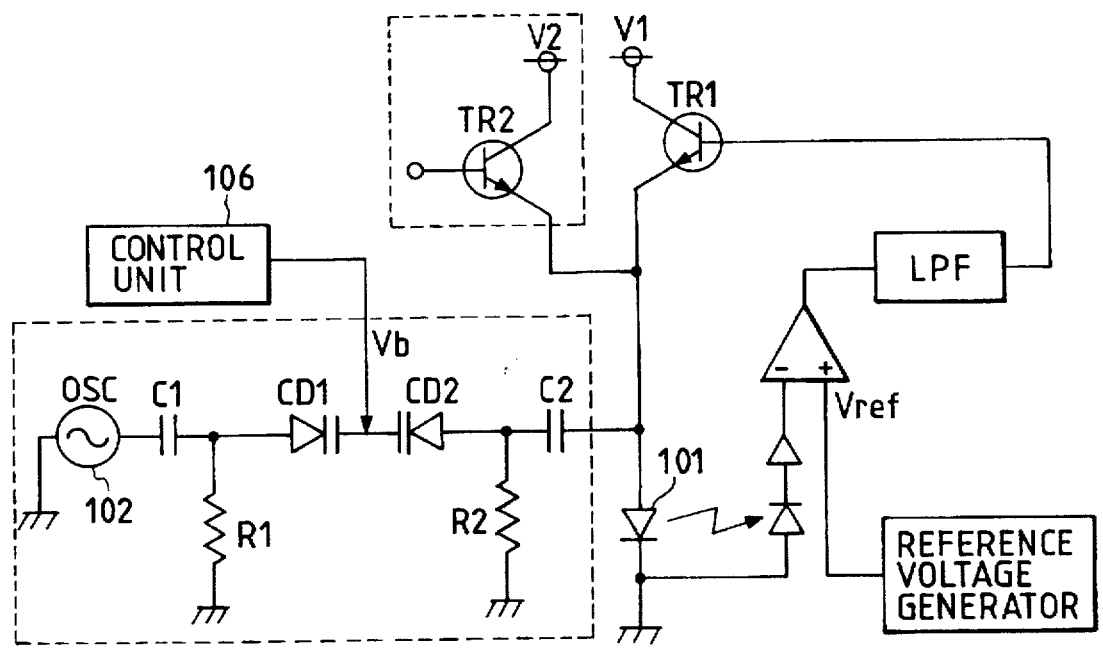
FIG. 1 is a circuit diagram to show a laser drive circuit as a conventional example.
Figure 2:
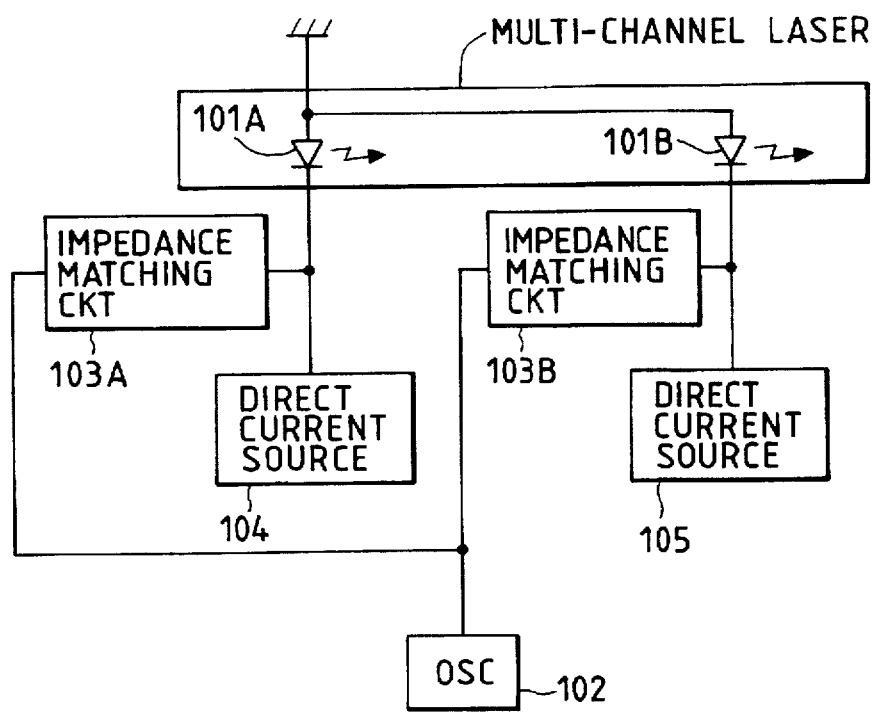
FIG. 2 is a block diagram to show a laser drive circuit as another conventional example.
Figure 3:
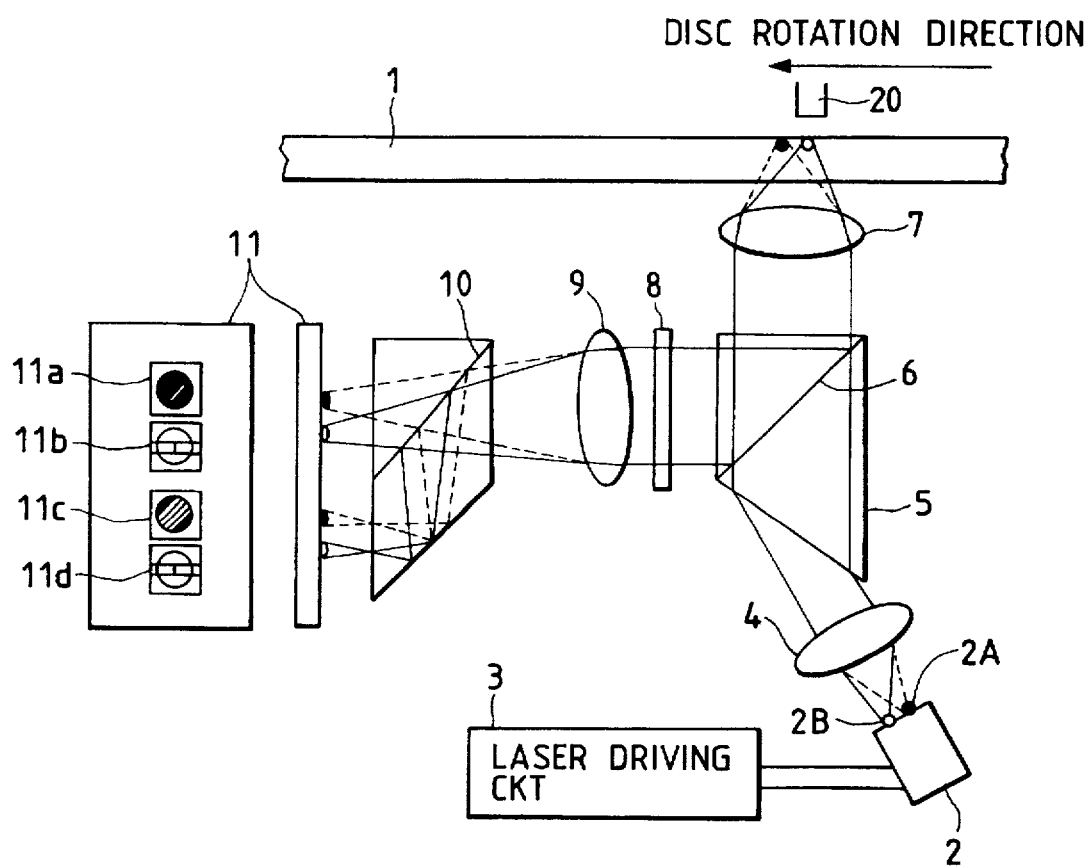
FIG. 3 is a structural drawing to show an embodiment of the optical information recording and/or reproducing apparatus of the present invention.

An embodiment of the present invention will be described in detail with reference to the drawings. FIG. 3 is a structural drawing to show an embodiment of the optical information recording and/or reproducing apparatus of the present invention. The present embodiment is described as an example of a magnetooptical disc apparatus of the optical modulation type. In FIG. 3, reference numeral 1 designates a magnetooptical recording medium having a spiral track, which is rotated at a predetermined speed by drive of a spindle motor, not shown. Numeral 20 denotes a magnetic head for applying a magnetic field to the magnetooptical recording medium 1. A light beam from a laser light source 2B for recording is modulated in intensity according to an information signal and the thus modulated beam is projected to the magnetooptical recording medium. As irradiating the magnetooptical recording medium with the modulated light, the magnetic head 20 applies the external magnetic field to the irradiated portion to effect recording of the information signal. Numeral 2 represents a monolithic multi-beam semiconductor laser having two laser light sources 2A, 2B on a same substrate, and the directions of polarization of the lasers are in the aligning direction of the lasers (within the plane of FIG. 3). The laser light source 2A is used exclusively in the reproduction of information, while the laser light source 2B is used for recording and erasing of information and for the generation of a servo signal. The laser light sources 2A, 2B of the semiconductor laser 2 are driven independently of each other by a laser driving circuit 3. A separation between radiative points of the monolithic multi-beam semiconductor laser 2 is set between the lower limit of about 50 µm, taking account of problems such as mutual characteristic interference due to laser heating, degradation of reliability, and beam separation in a detection optical system, and the upper limit of about 100 µm, taking account of the problems of generation of aberrations in a collimator lens 4 and an objective lens 7, and degradation of the tracking accuracy of two beams due to spread of beam separation on the medium.

Laser beams emitted from the laser light sources 2A, 2B are each collimated by the collimator lens 4, and thereafter they are shaped into light beams of a circular cross section by a beam shaping prism 5, and pass through a polarizing beam splitter 6 then enter the objective lens 7. Then, the two light beams from the laser light sources 2A, 2B are converged by the objective 7 to be focused as fine light spots on the magnetooptical recording medium 1. The two light spots are focused as juxtaposed at a separation of about 15 to 20 µm on a same track in the recording medium 1, and the light spot from the laser light source 2B is formed on the upstream side of the light spot from the laser light source 2A with respect to the rotating direction of the recording medium 1. Namely, the light spot for reproduction scans after the light spot for recording. In this manner the reproduction light spot from the laser light source 2A immediately reproduces information recorded by the recording light spot from the laser light source 2B, thereby simultaneously performing recording and recording checking (verification). Therefore, the arrangement of simultaneously performing recording and recording checking with two light spots arranged in the above manner can obviate waiting for the time of one rotation of the recording medium 1 for recording checking, which can remarkably increase the operation speed by decreasing the time necessary for recording.

The two light spots projected to the recording medium 1 in this manner are each reflected by the medium surface. In this case, the direction of polarization of linearly polarized light slightly rotates according to the recording information on the medium surface. The recording information is reproduced based on polarization components (Kerr components) in the direction perpendicular to the polarization direction of the laser beams emitted from the laser light sources 2A, 2B, out of polarized light generated due to an angle of the rotation (Kerr rotation angle). The reflected light from recording medium 1 again passes through the objective 7 to enter the polarizing beam splitter 6, which reflects all Kerr components out of the reflected light from the medium 1 and reflects some of Fresnel components in a direction perpendicular to the Kerr components toward a detection optical system (8, 9, 10, 11). Further, a half wave plate 8 rotates the polarization direction by 45° in a plane perpendicular to the plane the drawing, and thereafter the light passes through a condenser lens 9 to enter a polarizing beam splitter 10.

The polarizing beam splitter 10 functions as a perfect polarizing beam splitter, and the Fresnel components incident thereinto are separated by transmission and reflection as signals with equal light quantity and same phase. Further, the Kerr components are separated by transmission and reflection as signals with 180°-inverted phases. A photodetector 11 detects combined signals of the above Fresnel components with the Kerr components. As for the light beam from the reproduction laser light source 2A, the transmitted light is received by a sensor 11a and the reflected light is received by a sensor 11c. As for the light beam from the recording laser light source 2B, the transmitted light is received by a sensor 11b and the reflected light is received by a sensor 11d, which is used in detecting the servo signal for focus control and tracking control.

Signals from sensors 11a, 11c in the photodetector 11 are differentially detected by a differential amplifier not shown, whereby same phase components are eliminated to obtain only the Kerr components, thereby reproducing the recording information as magnetooptical signals. On the other hand, signals from sensors 11b, 1id in the photodetector 11 are sent to a servo signal generating circuit (not shown), which generates a focus error signal and a tracking error signal. An example of the method for detecting the focus error signal is a differential beam size method, and an example of the method for detecting the tracking error signal is the differential push-pull method. Then, a focus control circuit, not shown, performs focus control based on the focus error signal so that the light spots from the laser light sources 2A, 2B are focused on the medium, and a tracking control circuit performs tracking control based on the tracking error signal so that the light spots from the laser light sources 2A, 2B perform scanning to follow the information track.

Next, in case of recording information, the output power of the laser light source 2A in the monolithic multi-beam semiconductor laser 2 is controlled, for example at about 1.4 mW on the recording medium 1, by the laser drive circuit 3 because it is used exclusively for reproduction; the output power of the laser light source 2B is controlled, for example at about 7 mW on the recording medium 1, because it is used for recording (or erasing). The light power of the recording laser light source 2B is modulated depending upon recording information signals and a constant magnetic field for recording is applied from the magnetic head 20, thereby recording a series of information in the recording medium 1. The high-frequency superimposing current to the laser light source 2B is always constant, and modulation of the light power is effected by changing the direct current. The light spot from the recording laser light source 2B is formed on the upstream side of the light spot from the reproducing laser light source 2A as described previously, so that the reproducing light spot can immediately reproduce the information recorded by the recording light spot, thereby realizing simultaneous verification with recording. Upon erasing, a light beam of a predetermined power is applied from the laser light source 2B and a magnetic field for erasing is applied from the magnetic head 20.

Since slight rotation of the polarization is detected in reproducing the recording information as described above, high SN ratios are necessary for detecting weak signals reaching the photodetector 11, and it is required to suppress the laser noise, giving especially large weight in the noise, as much as possible. Because of this, a large high-frequency current is superimposed on the direct current supplied from the laser driving circuit 3 to the reproducing laser light source 2A, and the laser light source 2A needs to be turned on and off at a high frequency so as to keep the lower limit of the amplitude of the high-frequency current below the threshold value of laser. Since it is difficult to directly measure the amplitude of the high-frequency current applied to the reproducing laser light source 2A, the amplitude of the high-frequency current can be quantitatively captured by defining the superposition rate as the ratio of light powers when the high-frequency current is turned on and off while the laser light source 2A is driven at a constant current by the laser driving circuit 3. For example, assuming that the laser power on a medium when the high-frequency current is superimposed on the constant current is 1.4 mW and the laser power on a medium when the laser is driven only by the constant current is 0.14 mW, the superposition rate becomes 1000%. That the lower limit of the amplitude of the high-frequency current becomes lower than the threshold value of laser means that the superposition rate exceeds 100%; the greater the superposition rate, the larger the amplitude of the high-frequency current applied to the laser light source 2A, whereby the upper limit of the amplitude of the high-frequency current superimposed on the direct current reaches a high light power level.

On the other hand, the laser light source 2B is used for recording (or erasing) and for generation of a servo signal, and the servo signal is about one order larger and far narrower in band than the reproduction signal. Thus, sufficiently high SN ratios can be secured for the laser light source 2B without applying thereto such a large high-frequency current to the reproduction laser source 2A. Therefore, it is sufficient to set the maximum value of the amplitude of the high-frequency current supplied to the laser light source 2B below the rated value upon recording. Noting this point, the present invention employs such an arrangement that a large high-frequency current is supplied to the reproduction laser light source 2A while a high-frequency current sufficient to obtain the servo signal but not to cause breakage upon recording is continuously supplied to the recording laser light source 2B, regardless of whether recording or not.

Figure 4:
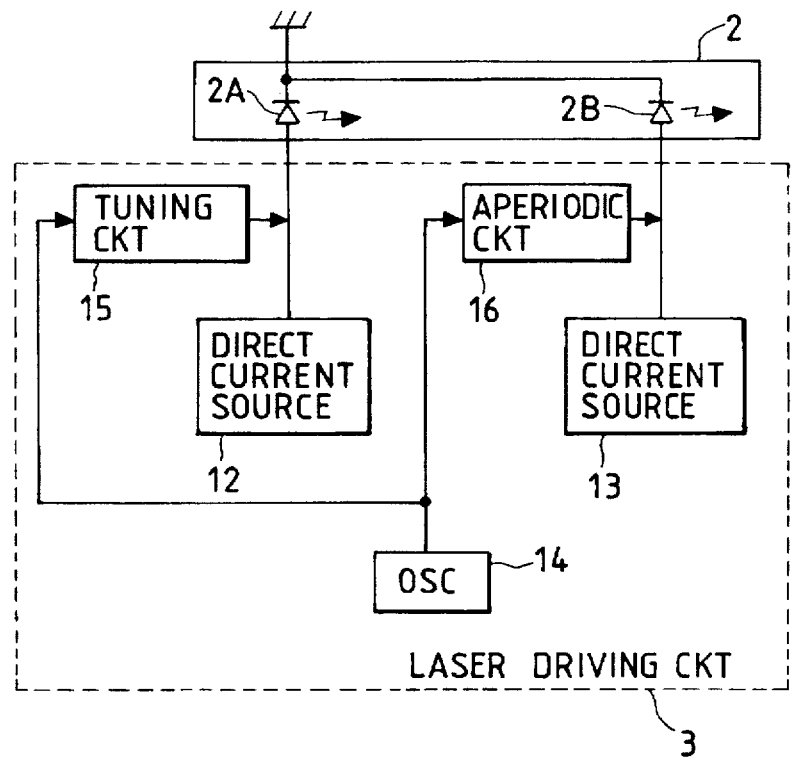
FIG. 4 is a block diagram to show a laser drive circuit of the embodiment of FIG. 3 in detail.

The current supply to the laser light sources 2A, 2B is next described. FIG. 4 is a block diagram to show a specific layout of the laser driving circuit 3. A direct current source 12 supplies a direct current to the laser light source 2A, and a direct current source 13 supplies a direct current to the recording laser source 2B. Further, a high-frequency oscillation circuit 14 is a common high-frequency current source for supplying a high-frequency current to the two laser light sources 2A, 2B, and is connected through a tuning circuit 15 to the laser light source 2A and through an aperiodic circuit 16 to the laser light source 2B. The tuning circuit 15 is a circuit for performing impedance matching between an internal impedance of the laser light source 2A and an output impedance of the high-frequency oscillation circuit 14. Performing the impedance matching in this manner, the high-frequency oscillation circuit 14 supplies a high-frequency current sufficient to reproduce a magnetooptical signal to the laser light source 2A.

The aperiodic circuit 16 is a circuit with low coupling efficiency. Since the circuit with low coupling efficiency couples the high-frequency oscillation circuit 14 with the laser light source 2B, the high-frequency current supplied to the laser light source 2B is one considerably smaller than the high-frequency current to the laser light source 2A but is sufficient to perform the servo operation and not to cause breakage upon recording. The high-frequency current to the laser light source 2B is constant irrespective of whether upon recording or not, and the output from the laser light source 2B is switched to the recording power upon recording by increasing the direct current from the direct current source 13. The arrangement does not include means for adjusting the high-frequency current depending upon the laser power.

In the laser drive circuit 3 as described, the high-frequency current is efficiently supplied to the laser light source 2A by coupling the high-frequency oscillation circuit 14 with the laser light source 2A through the tuning circuit 15, while the high-frequency current considerably smaller than that to the laser source 2A but sufficient to obtain the servo signal is supplied to the laser light source 2B by coupling the high-frequency oscillation circuit 14 with the laser light source 2B through the aperiodic circuit 16. The coarseness arrangement of coupling with the laser light source 2B by the aperiodic circuit 16 functions to weaken the influence to the high-frequency oscillation circuit 14.

Figure 5:
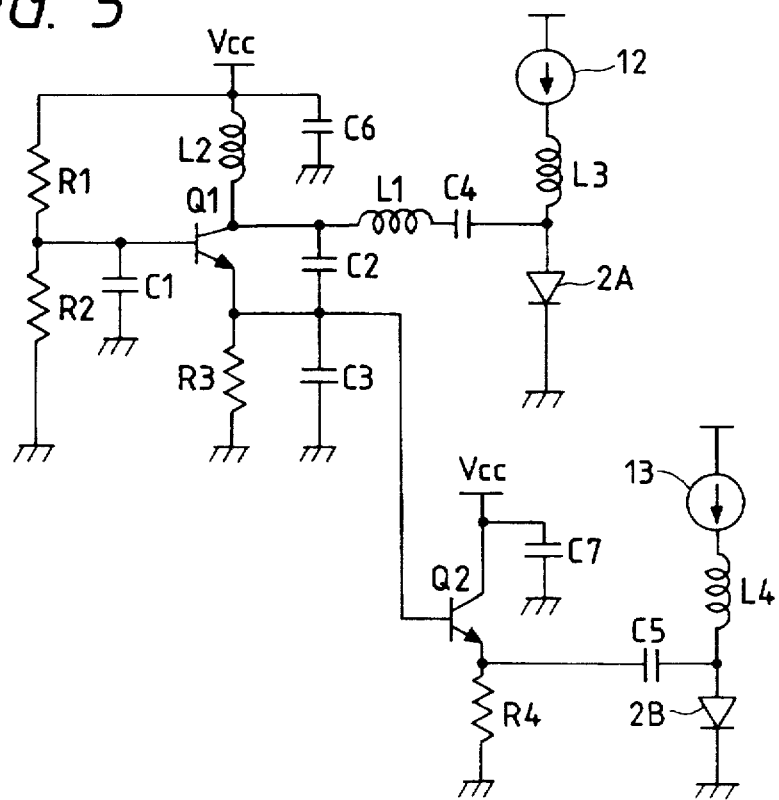
FIG. 5 is a circuit diagram to show a specific layout of the laser drive circuit.

FIG. 5 is a circuit diagram to illustrate the laser driving circuit 3 in more detail. In FIG. 5, a circuit including a transistor Q1 and peripheral devices of resistors R1-R3, capacitors C1-C4, and inductor L1, is a Colpitts oscillator composing the high-frequency oscillation circuit 14. Further, devices including the capacitors C2-C4 and inductor L1 compose the tuning circuit 15. The capacitors C1-C4 and inductor L1 are commonly used to the resonance circuit of the high-frequency oscillation circuit 14, and the tuning circuit 15. A circuit including a transistor Q2 and peripheral devices of resistor R4 and capacitor C5 is an emitter follower circuit, which buffer-amplifies an oscillation output of the high-frequency oscillation circuit 14 to supply the amplified output to the laser light source 2B. Here, L2-L4 are inductors for blocking high-frequency waves.

The high-frequency supply current to the laser light source 2A is adjusted to an optimal value by changing the operating current of the transistor Q1 while changing constants of the capacitors C2-C4 or inductor L1 so as to make impedance matching between the laser light source 2A and the high-frequency oscillation circuit 14 at the oscillation frequency of the high-frequency oscillation circuit 14. For adjusting the high-frequency current to the laser light source 2B, the optimal value is adjusted by adjusting a high-frequency gain while changing the operating current of transistor Q2 or by changing the capacitance of the capacitor C5.

The inventor conducted experiments for driving the laser light sources 2A, 2B by the laser driving circuit 3 of FIG. 5, and obtained such good results that the superposition rate of the laser light source 2A was 1000 to 3000% while the superposition rate of the laser light source 2B was 105 to 130%, at the oscillation frequency of about 500 MHz.

A variety of modifications can be constructed for the laser driving circuit 3 without the need to be limited to the layout of FIG. 5. For example, the oscillator may be constructed using a microstrip line, and the high-frequency current may be supplied from the middle of the line through a capacitor to the laser light source. Also, an input of the emitter follower circuit may be taken from the anode of the laser light source 2A, provided that an extra bias circuit is needed in that case. Further, a buffer amplifier may be interposed between the oscillator and the laser light source 2A, but in that case great care needs to be taken to avoid abnormal oscillation caused by an output tuning circuit (resonance circuit) of the buffer amplifier and the resonance (tuning) circuit of the oscillator.

Although the embodiment was described with an example of the magnetooptical disc apparatus of the optical modulation type, it is needless to mention that the present invention is by no means limited to the example, but can be applied to any apparatus for performing recording and/or reproduction using a plurality of semiconductor lasers.

As described above, the present invention has the following advantages.

(1) Since the high-frequency oscillation circuit is commonly used for the semiconductor lasers, the circuit layout can be simplified.

(2) Since the high-frequency oscillation circuit is coupled with the laser light source for recording or erasing through the aperiodic circuit, the risk of causing abnormal oscillation is lowered, variations of the high-frequency current due to variations of oscillation frequency can be kept very small, and the high-frequency oscillation circuit can be constructed to be a small size.

(3) Since the high-frequency current to the recording or erasing semiconductor laser is a current sufficient always to obtain the servo signal but not to cause breakage upon recording, there is no need to change the high-frequency current depending upon whether recording or not, and a control circuit therefor is not necessary.

(4) Since the high-frequency current to the recording or erasing semiconductor laser is considerably smaller than that to the reproducing semiconductor laser, the aperiodic circuit used for coupling with the high-frequency oscillator can be constructed in a small size.

What is claimed is:

1. An optical information recording and/or reproducing apparatus comprising:

a first semiconductor laser for generating a light beam for recording or erasing information on an optical information recording medium;

a second semiconductor laser for generating a light beam for reproducing recording information from the optical information recording medium;

first direct current supplying means for supplying a first direct current to said first semiconductor laser;

second direct current supplying means for supplying a second direct current to said second semiconductor laser;

high-frequency current supplying means for supplying high-frequency currents to said first semiconductor laser and said second semiconductor laser, said high-frequency current supplying means supplying a smaller high-frequency current to said first semiconductor laser than that to said second semiconductor laser;

tuning means provided between said second semiconductor laser and said high-frequency current supplying means, said tuning means performing impedance matching between an internal impedance of said second semiconductor laser and an output impedance of said high-frequency current supplying means; and aperiodic means provided between said first semiconductor laser and said high-frequency current supplying means, said aperiodic means having a circuit with low coupling efficiency.

2. The apparatus according to claim 1, wherein said first semiconductor laser and said second semiconductor laser are disposed on a same substrate.

3. A method for driving a plurality of semiconductor lasers by supplying a direct current and a high-frequency current to each of said plurality of semiconductor lasers, comprising:

a step of providing a first semiconductor laser for generating a light beam for recording or erasing information on an optical information recording medium;

a step of providing a second semiconductor laser for generating a light beam for reproducing recording information from the optical information recording medium;

a step of supplying a first direct current to first semiconductor laser;

a step of supplying a second direct current to second semiconductor laser;

a step of supplying high-frequency currents to the first and second semiconductor lasers with high-frequency current supplying means, wherein said high-frequency current supplying step supplies a smaller high-frequency current to the first semiconductor laser than the high-frequency current supplied to the second semiconductor laser;

performing impedance matching between an internal impedance of the second semiconductor laser and an output impedance of the high-frequency current supplying means with tuning means provided between the second semiconductor laser and the high frequency current supplying means; and a step of supplying aperiodic means between the first semiconductor laser and the high-frequency supplying means, the aperiodic means having a circuit with low coupling efficiency.

* * * * *

UNITED STATES PATENT AND TRADEMARK OFFICE
CERTIFICATE OF CORRECTION

PATENT NO. : 5,781,222

DATED : July 14, 1998

INVENTOR(S): TAKESHI YAMAWAKI, ET AL.

It is certified that error appears in the above-identified patent and that said Letters Patent is hereby corrected as shown below:

<u>COVER PAGE, AT [57] Reference Cited</u>,
Foreign Patent Documents, "03203820" should read
--03-203820--, and "0573948" should read --05-73948--.

<u>COLUMN 2</u>,
Line 60, "example to" should read --example,--.

<u>COLUMN 3</u>,
Line 5, "service" should read --device--.

<u>COLUMN 4</u>,
Line 6, "a" should read --the--.
Line 32, "a" should read --the--.
Line 66, "plane" should read --plane of--.

<u>COLUMN 5</u>,
Line 20, "lid" should read --11d--.

Signed and Sealed this

Fifth Day of October, 1999

Attest:

Q. TODD DICKINSON

*Attesting Officer*   Acting Commissioner of Patents and Trademarks